US008851716B2

(12) United States Patent
Bertram et al.

(10) Patent No.: US 8,851,716 B2
(45) Date of Patent: Oct. 7, 2014

(54) LAMP INCORPORATING A HEAT SINK AND AN OPTICALLY TRANSMISSIVE COVER

(75) Inventors: Ralph Bertram, Nittendorf (DE); Nicole Breidenassel, Bad Abbach (DE); Guenter Hoetzl, Regensburg (DE); Robert Kraus, Regensburg (DE)

(73) Assignee: OSRAM GmbH, Munich (DE)

( * ) Notice: Subject to any disclaimer, the term of this patent is extended or adjusted under 35 U.S.C. 154(b) by 0 days.

(21) Appl. No.: 13/388,031

(22) PCT Filed: Jul. 20, 2010

(86) PCT No.: PCT/EP2010/060475

§ 371 (c)(1),
(2), (4) Date: Mar. 20, 2012

(87) PCT Pub. No.: WO2011/012498

PCT Pub. Date: Feb. 3, 2011

(65) Prior Publication Data

US 2012/0163001 A1 Jun. 28, 2012

(30) Foreign Application Priority Data

Jul. 30, 2009 (DE) ......................... 10 2009 035 370

(51) Int. Cl.

| | |
|---|---|
| ***H01J 17/24*** | (2012.01) |
| ***H01L 33/64*** | (2010.01) |
| ***F21V 3/04*** | (2006.01) |
| ***F21V 3/00*** | (2006.01) |
| ***F21K 99/00*** | (2010.01) |
| ***F21V 3/02*** | (2006.01) |
| *F21V 29/00* | (2006.01) |
| *F21V 17/10* | (2006.01) |
| *F21Y 103/00* | (2006.01) |
| *F21Y 101/02* | (2006.01) |

(52) U.S. Cl.
CPC ............... *F21K 9/135* (2013.01); *F21V 29/225* (2013.01); *F21V 17/101* (2013.01); *F21V 3/0409* (2013.01); *F21V 29/242* (2013.01); *F21V 29/2262* (2013.01); *F21V 3/005* (2013.01); *F21Y 2103/003* (2013.01); *F21V 3/02* (2013.01); *F21Y 2101/02* (2013.01)
USPC ............. 362/373; 362/307; 362/294; 313/45; 313/46; 313/44

(58) Field of Classification Search
USPC ......... 313/17–47, 317–318.02; 362/373, 294, 362/307–309
See application file for complete search history.

(56) References Cited

U.S. PATENT DOCUMENTS 6,908,219 B1 * 6/2005 Reiss ............................ 362/335
7,153,000 B2 * 12/2006 Park et al. ..................... 362/331
(Continued)

FOREIGN PATENT DOCUMENTS

CN 101029712 9/2007
CN 201582724 U * 9/2010
(Continued)

OTHER PUBLICATIONS

Office Action dated Aug. 19, 2013 issued in the corresponding Canadian Patent Application No. 2,769,496.

*Primary Examiner* — Mariceli Santiago
(74) *Attorney, Agent, or Firm* — Cozen O'Connor

(57) ABSTRACT

A lamp (1; 16; 20; 24; 30; 37; 39), at least comprising: a heat sink (2; 17; 21; 25), which bears at least one light source; (10) and an at least partially optically transmissive cover (11; 19; 23; 26) for the at least one light source (10), said cover being fastened to the heat sink (2; 17; 21; 25), the cover (11; 19; 23; 26; 31; 38; 40) having a wall thickness (d) which, at least sectionally, tapers as the distance from the heat sink (2; 17; 21; 25) increases.

19 Claims, 9 Drawing Sheets

(56) References Cited

U.S. PATENT DOCUMENTS

| | | | | |
|---|---|---|---|---|
| 7,378,686 | B2 * | 5/2008 | Beeson et al. | 362/337 |
| 7,422,347 | B2 * | 9/2008 | Miyairi et al. | 362/335 |
| 7,649,697 | B2 * | 1/2010 | Yoon et al. | 362/335 |
| 7,859,614 | B2 * | 12/2010 | Moon et al. | 349/69 |
| 2005/0068777 | A1 | 3/2005 | Popovic | |
| 2006/0138437 | A1 | 6/2006 | Huang et al. | |
| 2008/0278655 | A1 | 11/2008 | Moon et al. | |
| 2008/0278944 | A1 | 11/2008 | Yoon et al. | |
| 2009/0095967 | A1 * | 4/2009 | Masui et al. | 257/98 |
| 2011/0075408 | A1 * | 3/2011 | Negley et al. | 362/231 |

FOREIGN PATENT DOCUMENTS

| | | |
|---|---|---|
| DE | 20 2007 008 258 | 10/2007 |
| DE | 20 2008 017 219 | 4/2009 |
| GB | 2 428 467 | 1/2007 |
| JP | 2003 281925 | 10/2003 |
| KR | 10-0809658 | 3/2008 |

* cited by examiner

LAMP INCORPORATING A HEAT SINK AND AN OPTICALLY TRANSMISSIVE COVER

RELATED APPLICATIONS

This is a U.S. national stage of application No. PCT/EP2010/060475, filed on Jul. 20, 2010.

This application claims the priority of German application no. 10 2009 035 370.4 filed Jul. 30, 2009, the entire content of which is hereby incorporated by reference.

FIELD OF THE INVENTION

The invention relates to a lamp which has a heat sink, which bears at least one light source, in particular at least one semiconductor light-emitting element, as well as a cover fastened to the heat sink.

BACKGROUND OF THE INVENTION

In general, light-emitting diodes (LEDs) have relatively low brightnesses and relatively short lives at relatively high temperatures. In the case of LED retrofit lamps, a heat sink is used to dissipate heat or cool the LED(s). However, the space available for the heat sink is limited by a usually standardized outer contour of the lamp to be replaced and by the amount of space required for a bulb and driver electronics. Owing to the physical limitation, the size of the volume of the heat sink which can be used effectively for cooling is limited, and thus so is the cooling power. In the case of LED lamps with a standard-limited size, the power of the light source and therefore the brightness are limited corresponding to the limited cooling power.

US 2007/0080362 A1 has disclosed an LED arrangement with a high-power LED chip, which has a first surface and a second surface, the second surface being fitted to a substrate. The second surface is in close thermal contact with an optically transmissive heat sink, which has a thermal conductivity of more than 30 W/(m·K). Providing the optically transmissive heat sink can double the thermal conduction of the LED die, which increases the life, efficiency or luminous intensity or an equilibrium comprising these three factors.

SUMMARY OF THE INVENTION

One object of the present invention is to provide, using simple means, an improvement in heat dissipation in a lamp in particular of the type mentioned at the outset.

This and other objects are attained in accordance with one aspect of the present invention directed to a lamp that comprises: a heat sink, which bears at least one light source, and an at least partially optically transmissive (transparent or translucent or opaque) cover or covering element for the at least one light source, in particular semiconductor light emitting element, the cover or covering element being fastened to the heat sink, and the cover having a wall thickness which, at least sectionally, tapers as the distance from the heat sink increases. In other words, the cover has a wall thickness which, at least sectionally, increases with increasing proximity (shorter distance) to the heat sink.

Owing to the comparatively large wall thickness in the region of the heat sink, a correspondingly large contact face is produced between the cover and the heat sink. As a result, increased heat transfer from the heat sink into the covering element is made possible than would be possible without the widened wall thickness. As a result, the cover is heated to a greater extent and emits more heat to the surrounding environment. In other words, the widened (thermal) contact face provides the possibility of increased heat loss via the cover. A thick wall thickness at a greater distance from the heat sink or the contact face no longer results in a significantly increased cooling effect owing to the heat flow which is distributed laterally or areally in the cover (is directed laterally), since, owing to the heat emission to the surrounding environment (heat loss), less and less heat arises as a result of the direct lateral thermal conduction as the distance from the contact face increases.

Owing to the heat loss via the cover or the surface thereof, improved cooling of the light sources can be achieved without the size of the lamp changing. It is thus possible for relatively large power losses to be dissipated without any substantial enlargement of the dimensions of the lamp.

In general, the type of light source is not restricted. However, it is preferred if the at least one light source comprises at least one semiconductor light source, for example a light-emitting diode or a diode laser. Particularly preferred here is the use of at least one light-emitting diode as the at least one light source. In this case, the type of the at least one light-emitting diode is not restricted, but can include, for example, a plurality of individual LEDs or one or more LED clusters comprising LED chips applied to a common substrate. The color(s) of the at least one light-emitting diode is likewise not restricted and can include "white", for example. The at least one light-emitting diode can be an inorganic or an organic light-emitting diode. The light sources can generally be equipped with downstream optical elements.

One configuration is for the cover to have a greatest wall thickness at a contact face with respect to the heat sink. This provides the possibility of particularly high heat dissipation from the heat sink into the cover.

A further configuration is for the wall thickness of the cover to taper continuously as the distance from the heat sink increases. A continuous reduction in the wall thickness of the cover as the distance from the heat sink or the contact face with respect to the heat sink increases means that it is possible to realize a good compromise between lateral and transverse thermal conduction into or through the cover in the different regions of the cover.

An alternative configuration is for the wall thickness of the cover to taper, sectionally, as the distance from the contact face with respect to the heat sink increases and then for the wall thickness of the cover to remain substantially constant.

A small wall thickness of the cover in a region remote from the heat sink, in particular at the greatest distance from the heat sink, is advantageous since heat loss to the surrounding air is produced there to the greatest extent by a transverse heat flow out of a heated interior or accommodating area and not by the lateral heat flow from the heat sink. The transverse heat flow is more effective, the smaller the wall thickness of the cover. A small wall thickness of the cover is also advantageous from an optical point of view since transmission increases as the wall thickness of the cover decreases and therefore at least the emitted brightness is damped to a certain degree.

A further configuration is for the cover to be fastened to the heat sink by means of at least one bonding agent with good thermal conductivity. The use of the bonding agent has the advantage that the connection or the contact faces between the heat sink and the cover can have a geometrically simple configuration; in particular the connection at planar contact faces is possible.

The bonding agent can be a bonding agent with good thermal conductivity, for example a thermally conductive paste, a thermally conductive adhesive or at least one thermally conductive pad. In general, the effect of the bonding agent should be minimized to a heat conduction. However, the invention is not restricted to the selection of a bonding agent with good thermal conductivity. Thus, given a small thickness of the bonding agent, for example a thin adhesive layer, an influence of the coefficient of thermal conductivity of the bonding agent on a heat flow through the bonding agent given a sufficiently large contact face is low for most bonding agents.

Alternatively, the cover can also be fitted to the heat sink by means of mechanical connecting means, for example by means of a plug-type connection or a clamp or clamping connection etc. In this case, a small air gap can also be provided between the heat sink and the cover. If this air gap is sufficiently narrow, a significant heat transfer through the air gap can also take place given a sufficiently large contact face. The contact face of the cover is then a purely thermal contact face or heat transfer face.

Alternatively, the cover can also be screwed into the heat sink, it being possible for the cover to have, for example at its contact face with the heat sink, a screw form and for the heat sink to have a matching thread form. This increases the contact face between the cover and the heat sink further.

In principle, the material of the cover does not need to be chosen specifically for its thermal conductivity. Thus, it is possible for a conventional polymer or glass to be used for the cover, for example a conventional lamp bulb material. However, a material with good thermal conductivity is preferred. Good thermal conduction improves lateral heat distribution in the cover, as a result of which an effective cooling area within the cover is enlarged and the heat can be emitted to the surrounding environment more effectively. At the same time, the good thermal conduction improves transverse thermal conduction from an interior surrounded by the cover through the cover.

In addition, a configuration is for the cover to consist of glass. The use of glass has the advantage that glass is comparatively inexpensive, is easily colored, can be shaped easily and is aging-resistant. In addition, glass can be roughed up easily or can be configured with a diffusely scattering effect in some other way, in order to make the light source not directly visible from the outside.

A specific configuration is for the cover to have, for example, a thermal conductivity of between 1 W/(m·K) and 2 W/(m·K). In particular, a thermally conductive glass with a coefficient of thermal conductivity $\lambda$ of approximately 1.2 W/(m·K) or more is preferred. While conventional glasses, such as window glass, have a coefficient of thermal conductivity $\lambda$ of between 0.8 and 1.0 W/(m·K), Borofloat glass, for example, has a $\lambda$ of approximately 1.2 W/(m·K), N-BK10 has a $\lambda$ of approximately 1.32 W/(m·k) and Zerodur has a $\lambda$ of approximately 1.46 W/(m·k). Owing to the comparatively high thermal conductivity, a large-area heat distribution in the cover and thus efficient heat dissipation via the outer surface of the cover is achieved.

Alternatively, the use of an optically transmissive polymer (for example polycarbonate) or an optically transmissive ceramic (for example an alumina ceramic) is also possible, for example. Thus, an optically transmissive ceramic can reach a coefficient of thermal conductivity $\lambda$ of 30 W/(m·k) or more. Optically transmissive ceramics can in this case be used in all modifications, i.e. monocrystalline (i.e. in the case of alumina as sapphire), quasi-monocrystalline or polycrystalline, for example. In particular, alumina and in this case very particularly sapphire are characterized by high thermal conductivity, resistance to environmental influences and good availability.

A polymer filled with a material with high thermal conductivity can be used as a polymer, for example.

In addition, a configuration is for the cover to have a dome-like shape. Such a cover is particularly suitable for a retrofit incandescent lamp, for example.

Alternatively, the cover can have an open or a closed tubular shape. Such a cover is suitable, for example, for a retrofit fluorescent tube or a retrofit linear lamp (for example of the type Linestra by Osram).

A specific configuration is for an (in particular thermal) contact face of the cover with respect to the heat sink to at least partially correspond to a (lower) resting face of the cover. In the case of the dome-like shape and the open tubular shape, the contact face of the cover at the same time represents the resting face of the cover on the heat sink and therefore generally the lowest point thereof. In this case, in particular the wall thickness can be reduced as the distance from the contact face increases or as the height increases, in particular continuously reduced. The highest point, the apse, therefore has the smallest wall thickness.

An alternative configuration is for the cover to have a disk-like shape. As a result, the cover is suitable in particular for a PAR (parabolic aluminized reflector) headlamp retrofit lamp or luminaire or light-emitting means therefor. The cover is particularly also suitable for lamps or retrofit lamps of the type MR16, alternatively also for other MR lamp shapes, such as MR11 or MR8.

Then, a further specific configuration is for a contact face of the cover with respect to the heat sink to be arranged laterally. In the case of the disk-like shape, the contact face of the cover at the same time represents the lateral bearing face of the cover (which usually corresponds to the side edge of the cover) on the heat sink and therefore usually the outermost point of said cover. In this case, in particular the wall thickness can be reduced as the distance from the contact face increases. The innermost point of the cover, in particular the central point thereof, therefore has the smallest wall thickness.

A further configuration is for the cover to have an optical function. This has the advantage that, at the same time, beam guidance or beam correction is made possible.

An alternative configuration to this is for the cover to be a substantially optically inactive cover, i.e. to be substantially for protecting the lamp.

A further configuration is for the at least one light source, in particular semiconductor light-emitting element, to be fastened to the heat sink via at least one substrate. The substrate can be, for example, a substrate of an LED cluster, i.e. a common substrate for a plurality of LED chips. In addition or as an alternative, the substrate can comprise at least one printed circuit board, for example for making contact with the LED cluster or at least one individual LED (LED module) and possibly for population with electronic components.

A further configuration may be for the cover to have a tubular shape which is closed at least on the lateral surface side and for the heat sink to be at least partially accommodated by the cover and to be at least partially fastened to a lower region of the cover, the lower region of the cover and an upper region of the cover having a comparatively smaller wall thickness than the two lateral regions of the cover.

A further advantageous configuration is for the cover to be substantially free from recesses on its inner side, i.e. to have substantially no recess. This provides the possibility of manufacture using the injection-molding process (in the case of polymer) or using the pressing method (in the case of glass or ceramic material). The inner side of the cover delimits the interior of the lamp.

A specific configuration may be for the cover to have substantially straight contours, at least laterally, on its inner side. This simplifies manufacture in the injection-molding process or in the pressing process in particular.

A further configuration is for the lamp to be a retrofit lamp, whose outer contour does not extend or does not substantially extend beyond an outer contour of a lamp to be replaced.

In particular for use with a incandescent-lamp retrofit lamp, it is advantageous for the cover, in terms of its outer dimensions, to follow the contour, in particular curvature, of the incandescent lamp to be replaced. This preferably applies analogously to retrofit lamps for replacing a lamp of a conventional type, for example a linear lamp, reflector lamp etc.

Embodiments of the invention can comprise in particular one or more of the following features:

A lamp, in particular an LED lamp, has a base, a heat sink, an LED module and a semitransparent or transparent cover, for example a lamp bulb or a semitransparent or transparent optical element or covering disk.

The cover (for example the bulb/the optical element/the covering disk) is preferably designed so as to be thicker towards the heat sink and has a broad-area connection face or contact face for thermal connection to the heat sink.

The cover is connected to the heat sink via the contact face, preferably by means of a bonding agent with good thermal conductivity, for example a paste, an adhesive and/or a pad etc. The bonding agent can be in particular a TIM (thermal interface material).

The cover preferably becomes thinner as the distance from the heat sink contact face increases.

BRIEF DESCRIPTION OF THE DRAWINGS

In the following figures, the invention will be described in more detail schematically with reference to exemplary embodiments. In this case, identical or functionally identical elements can be provided with the same reference symbols for reasons of clarity.

DETAILED DESCRIPTION OF THE DRAWINGS

Figure 1:
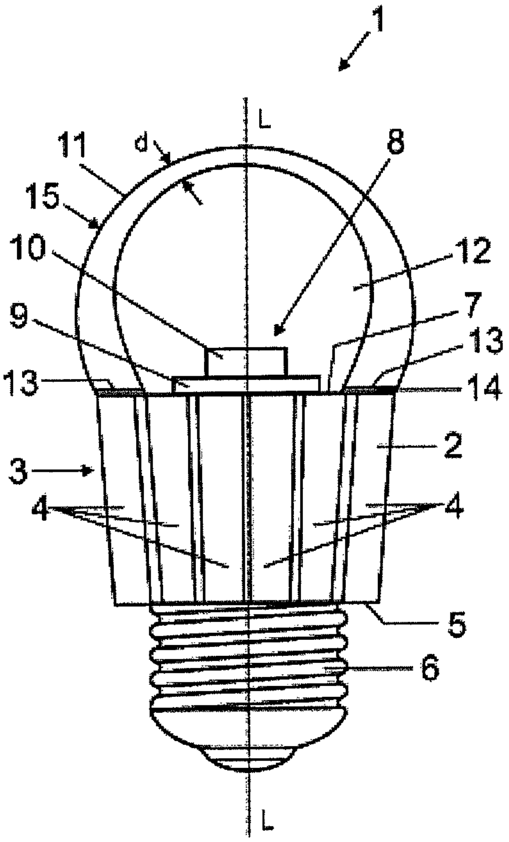
FIG. 1 shows, in a side view, a partial cross section of a bulb retrofit lamp.

FIG. 1 shows a partial side view of an incandescent-lamp retrofit lamp 1. The incandescent-lamp retrofit lamp 1 has a heat sink 2 (shown in a side view), which has a substantially angularly symmetrical shape about a longitudinal axis L of the incandescent-lamp retrofit lamp 1. In this case, radially outwardly directed cooling ribs 4 are provided on the outer side of the lateral surface 3. A base 6 for an incandescent lamp lampholder, for example an Edison base, is provided on a lower side 5 of the heat sink 2.

An LED module 8, which is supplied with current via the base 6, is fastened on an upper side 7 of the heat sink 2. The LED module 8 has at least one substrate in the form of a printed circuit board 9. One or more light-emitting diodes 10, to be precise in this case in the form of an LED cluster, in which a plurality of LED chips, possibly also emitting different colors, are fitted on a common substrate ("submount"), are located on the printed circuit board 9. The printed circuit board 9 can also additionally be populated with other electronic components, for example a driver module.

In addition, a dome-like cover 11 (shown in cross section) is adhesively bonded to the upper side 7 of the heat sink 2. The cover 11 is formed rotationally symmetrically about the longitudinal axis L and arches over the LED module 8 completely. By virtue of the cover 11 and the heat sink 2, an accommodating area for the LED module 8 and an interior 12 for the incandescent-lamp retrofit lamp 1 is thus provided. The cover 11 rests with a lower-side contact face 13, by means of an adhesive 14, flat and planar on the heat sink 2.

The adhesive 14 by means of which the cover 11 adheres to the heat sink 2, can be in the form of a thin adhesive layer consisting of silver conductive adhesive or an adhesive filled with a conductive ceramic, for example.

The cover 11 is opaque in order to assist a largely homogeneous emission characteristic which at least approximates that of a conventional incandescent bulb.

The cover 11 has a wall thickness d which tapers continuously as the distance from the heat sink 2 increases (as the height increases). As a result, the contact face 13, which at the same time represents the lower resting face of the cover 11, forms the region of the cover 11 with the greatest wall thickness d.

The cover 11 consists of a glass with a thermal conductivity Λ in a range of between 1 W/(m·K) and 2 W/(m·K), for example a Borofloat glass.

The cover 11 is substantially optically inactive, and therefore does not have the function of a lens or the like.

The function of the cover 11 will be explained in more detail below.

Figure 2:
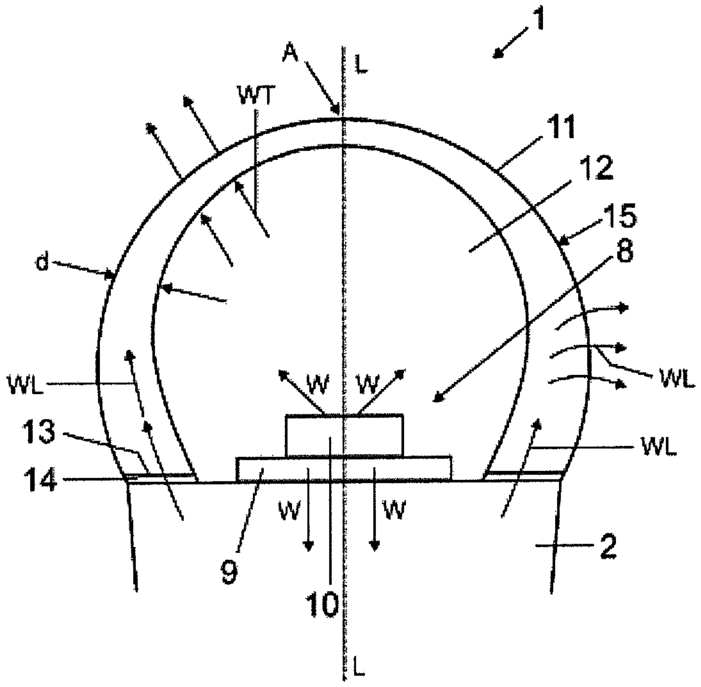
FIG. 2 shows a detail of the incandescent-lamp retrofit lamp shown in FIG. 1 in the region of a cover.

FIG. 2 shows a detail of the incandescent-lamp retrofit lamp 1 in the region of the cover 11. During operation of the LED module 8, said LED module heats up owing to a heat loss from the LEDs 10 and possibly further electronic components. The heat loss W is transmitted partially to the heat sink 2 and is emitted partially into the accommodating area 12. The heat sink 2 in turn emits the heat W to the surrounding environment substantially by means of heat convection or radiant heat, in particular via the cooling ribs 4.

Some of the heat W of the heat sink 2 is transmitted to the cover 11 through the adhesive layer 14 and further through the contact face 13, however. There, the heat W is diffused by means of a lateral thermal conduction (laterally directed heat flow WL) within the cover 11. This heating of the cover 11, starting from the contact face 13, results in the heat from the laterally directed heat flow WL being emitted to the surrounding environment via an outer side 15 of the cover 11 by means of heat convection or radiant heat, as is indicated by the arrows WL emerging outwards from the cover 11. By virtue of the heat emission towards the outside (heat loss), the laterally directed heat flow WL lessens as the distance from the contact face 13 increases.

Owing to the heated accommodating area 12, however, a transversely directed heat flow WT from the accommodating area 12 occurs towards the outside substantially perpendicularly through the cover 11. The two heat flows or heat distributions WL and WT are superimposed on one another in the cover 11.

At and shortly behind the contact face 13, the laterally directed heat flow WL will prevail, remote from the contact face 13 of the transversely directed heat flow WT. In particular at the highest point of the cover 11, the apse A, the influence of the laterally directed heat flow WL is at its lowest.

Owing to the relative broadening of the wall thickness d towards the contact face 13, the laterally directed heat flow WL is intensified and thus the cover 11 is heated to a greater extent. Thus, heat dissipation from the cover 11 towards the outside is also intensified, which in turn results in an increased heat dissipation from the LED module and improved cooling of the LED module 8.

Secondly, the relative reduction in the wall thickness d as the distance from the contact face 13 increases has the effect that passage of the transversely directed heat flow WT through the cover 11 is only slightly impeded, i.e. the heat-insulating effect of the cover 11 is low. The smallest wall thickness d therefore occurs at the apse A. The wall thickness d at any point on the cover can thus be optimized for maximum heat emission towards the outside. Owing to the heat flows WT and WL which typically do not change suddenly locally, a continuous change in the wall thickness d will in most cases provide the possibility of particularly effective heat dissipation.

For an incandescent-lamp retrofit lamp 1, a change in the wall thickness d from the contact face 13 to the apse A could advantageously be in a range between one half and one fifth. In other words, the wall thickness d at the contact face can preferably be broader than that at the apse A by a factor of two to five times, in particular approximately four times.

Figure 3:
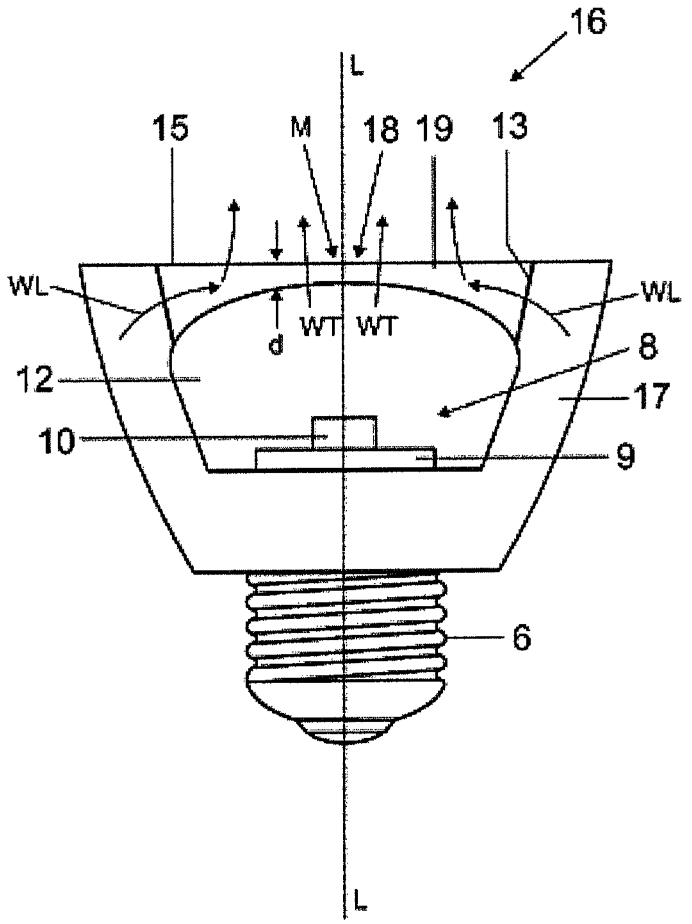
FIG. 3 shows a side view of a partial cross section of a reflector retrofit lamp.

FIG. 3 shows a side view of a partial cross section of a further retrofit lamp 16, for example for use in a lamp of the type MR16 or in the form of an PAR light-emitting means, for example PAR 30. In contrast to the incandescent-lamp retrofit lamp 1 shown in FIG. 1 and FIG. 2, the heat sink 17 is now in the form of a cup with an upper opening 18. The opening 18 is covered by means of a cover 19 with a disk-like basic shape. The cover 19 and the heat sink 17 in this case also again form an accommodating area 12 for the LED module 8.

In this exemplary embodiment, the contact face 13 does not correspond to a lower resting face, but to a lateral edge face of the cover 19 which is set at a slight angle for a firm fit on the heat sink 17.

In a manner which is in principle similar to the exemplary embodiment shown in FIG. 1 and FIG. 2, a laterally directed heat flow WL from the heat sink 17 through the contact face 13 into the cover 19 is produced in this case too, with this heat flow being weaker the further it is removed from the contact face 13 or the closer it comes to a center point M of the cover 19. A transversely directed heat flow WT, which transports heat from the accommodating area 12 through the cover 19 towards the outside, is superimposed on the laterally directed heat flow WL in this case too.

At the center point M, the relative influence of the laterally directed heat flow WL is at its lowest, and as a result that of the transversely directed heat flow WT is at its greatest, with the result that a smaller wall thickness d is preferred there than at the edge for effective heat dissipation from the cover 19 to the surrounding environment. Secondly, in order to produce a strong lateral heat flow WL, a greatest wall thickness d is preferred at the contact face 13 or at the edge region of the cover 19.

Figure 4:
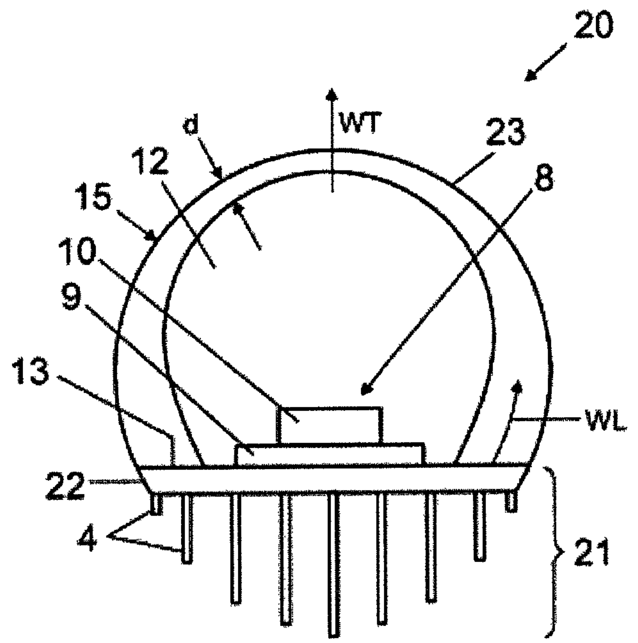
FIG. 4 shows a view at an angle of a cross-sectional illustration of a fluorescent-tube or linear-lamp retrofit lamp.

FIG. 4 shows a view at an angle of a cross-sectional illustration of a fluorescent-tube or linear-lamp retrofit lamp 20.

Figure 5:
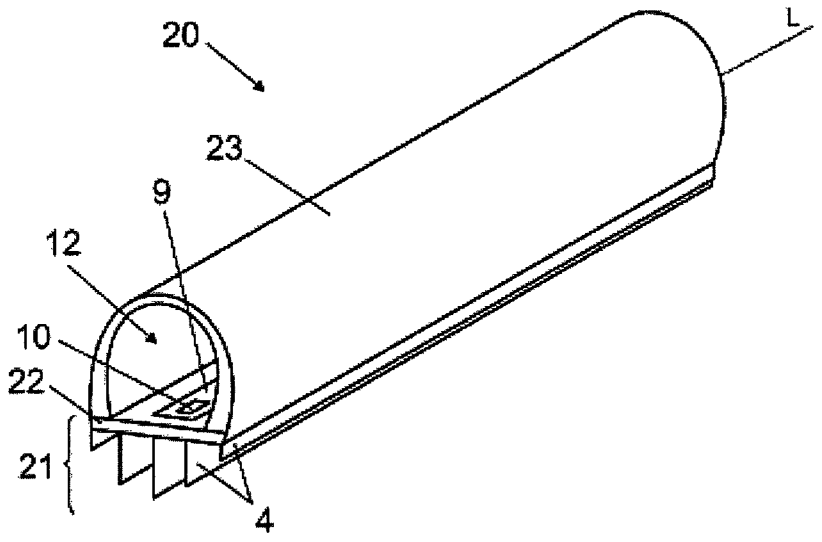
FIG. 5 shows a front view of a cross-sectional illustration of the retrofit lamp shown in FIG. 4.

FIG. 5 shows the fluorescent-tube or linear-lamp retrofit lamp 20 as a sectional illustration in a front view.

The retrofit lamp 20 has a substantially tubular basic shape and is used, for example, as a replacement for a conventional fluorescent tube or a linear lamp. A lower region of the retrofit lamp 20 has a heat sink 21, which is extended longitudinally along a longitudinal axis L of the retrofit lamp 20 and which has a plate-shaped bottom 22. On an upper side of the plate-shaped bottom 22, a plurality of light-emitting diodes 10 is arranged equidistantly along the longitudinal direction L, for example on a flexible strip-shaped mount 9. This can be realized, for example, by an LED module 8 in the form of an LED strip of the type Linearlight Flex by Osram. A plurality of cooling ribs 4 branch off perpendicularly downwards on a lower side of the plate-shaped bottom 22.

A correspondingly fitting elongate cover 23, which forms the accommodating area 12 for the LED module 8 with the heat sink 21, is fastened on the upper side 7 of the heat sink 21. In cross section, the shape of the cover 23 can substantially correspond to the shape of the cover 11 shown in FIG. 1 and FIG. 2, with the result that there is no need at this juncture to explain in any more detail the mode of operation of the cover 23, but reference is made analogously to FIG. 1 and FIG. 2.

Figure 6:
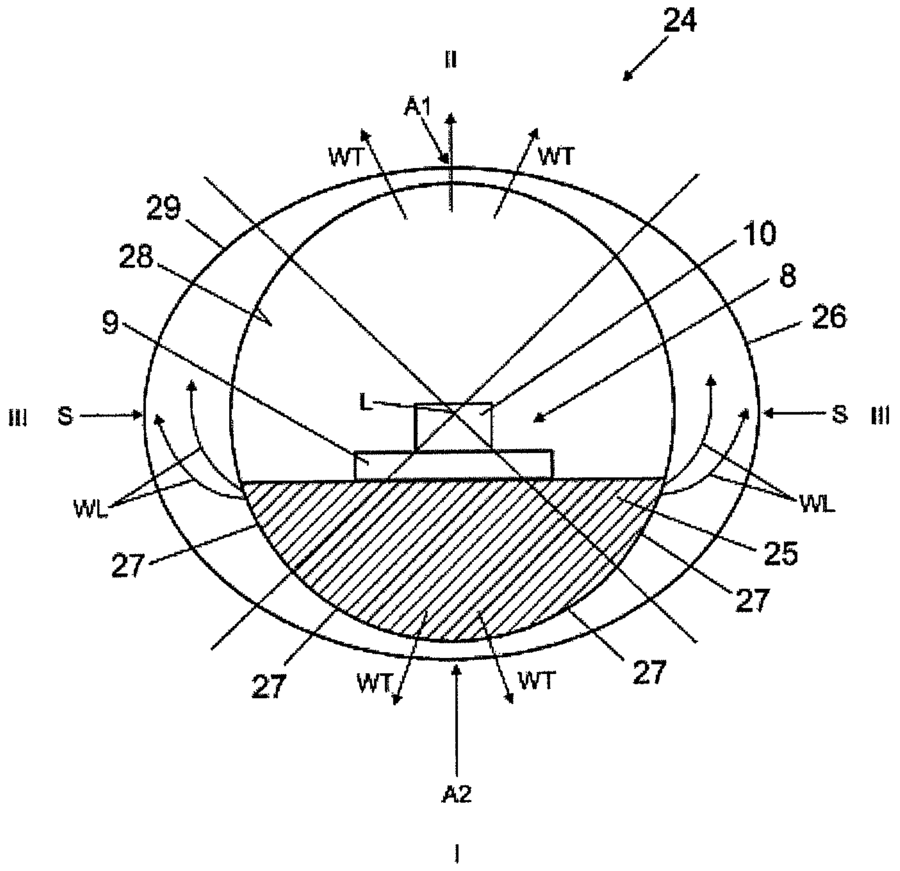
FIG. 6 shows a front view of a cross-sectional illustration of a further fluorescent-tube or linear-lamp retrofit lamp.

FIG. 6 shows a front view of a cross-sectional illustration of a further fluorescent-tube or linear-lamp retrofit lamp 24. In contrast to the embodiment shown in FIG. 4 and FIG. 5, the heat sink 25 with the LED module 8 is now surrounded, at least on the lateral surface side, completely by a tubular cover 26. In addition, the heat sink 25 is formed from a solid material, with the result that it forms, with the cover 26, a large-area contact face 27, which occupies a large proportion of the lower half of the cover 26.

In this case, lateral apexes S have the greatest wall thickness d, while an upper apex A1 and a lower apex A2 have the smallest wall thickness d. It is assumed here that the LED module 8 emits into an upper half space and the heat sink 25 is positioned on a lower region of the cover 26.

In another words, the cover 26 has a tubular shape which is closed at least on the lateral surface side, and the heat sink 25 is at least partially accommodated in the cover 26. The majority of the heat sink 25 is fastened to a lower region I (lower quarter-sector) of the cover 26, wherein the lower region I and an upper region II (upper quarter-sector) of the cover 26 which is opposite said lower region I can have a comparatively smaller wall thickness d than the two lateral regions III (lateral quarter-sectors) of the cover 26. In this case, the sectorization starts from a section line which at least substantially corresponds to the longitudinal axis L.

In particular, the wall thickness d of the cover 26 changes continuously and has the lowest wall thickness d in the upper region I at an upper apex A1 and in the lower region II at a lower apex A2.

On the other hand, the two lateral apexes S, which are located in the respective lateral region III, are the locations of the greatest wall thickness d.

Such a shape for the cover 26 can be produced, for example, such that a cross-sectional contour of an inner side 28 of the cover 26 is designed to be substantially circular, while a cross-sectional contour of an outer side 29 of the cover 26 has a substantially oval shape.

For its upper half or its upper section above the lateral apexes S, the cover 26 thus has a wall thickness d which tapers as the distance from the heat sink 25 or its contact face 27 with the heat sink 25 increase.

While the transversely directed heat flow WT dominates in the upper region I, it has been shown that a small wall thickness d is also advantageous at the lower region II since direct heat dissipation from the heat sink 25 in the transverse direction through the cover 26 makes possible more effective heat emission there than an optimization in respect of heat dissipation or heat spreading in the covering element 26. It has also been shown that an increased wall thickness d in the lateral regions III of the cover 26 makes possible more effective heat emission than an optimization in respect of a transversely directed heat dissipation through the covering element 26.

Figure 7:
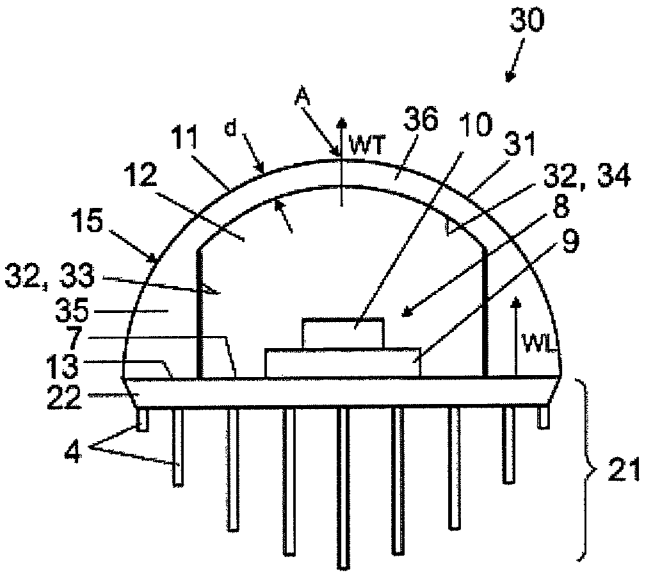
FIG. 7 shows a front view of a cross-sectional illustration of a fluorescent-tube or linear-lamp retrofit lamp in accordance with a further embodiment.

FIG. 7 shows a front view of a cross-sectional illustration of a retrofit lamp 30 in the form of a fluorescent-tube or linear-lamp retrofit lamp in accordance with a further embodiment. In contrast to the retrofit lamp 20 shown in FIG. 4, the cover 31 is merely in the form of a semicylinder on its outer side 15, with the result that it can be separated from a mold during production. It is likewise free of recesses on its inner side 32 (which, together with the bottom 22 of the heat sink 21, delimits the accommodating area 12). In particular, the inner side 32 is configured such that a lateral face 33 or side wall of the inner side 32, starting from the lower side of the cover 31, runs perpendicularly, so as to simplify production in the injection-molding process or pressing process. A cover face 34, which adjoins the lateral face 33 at the top and covers the accommodating area 12, is again configured with a curvature, in particular in the form of a cylinder sector, on the other hand.

The wall thickness d is at the greatest at the contact face 13 and is reduced in a section 35 or region which contains the lateral face 33 continuously as the distance from the contact face 13 increases. The adjoining section 36 or region which contains the cover face 34, on the other hand, has a constant wall thickness d. Thus, the cover 31 continues to have, as was the case with the retrofit lamp 20, a greater wall thickness d at the contact face 13 with respect to the heat sink 21 than at the point furthest removed from the heat sink 21, namely the (linear) apse A. Specifically, the wall thickness d at the contact face 13 is the greatest.

Alternatively, the section 36 can also taper further towards the apse A, starting from its point of attachment to the section 35.

Figure 8:
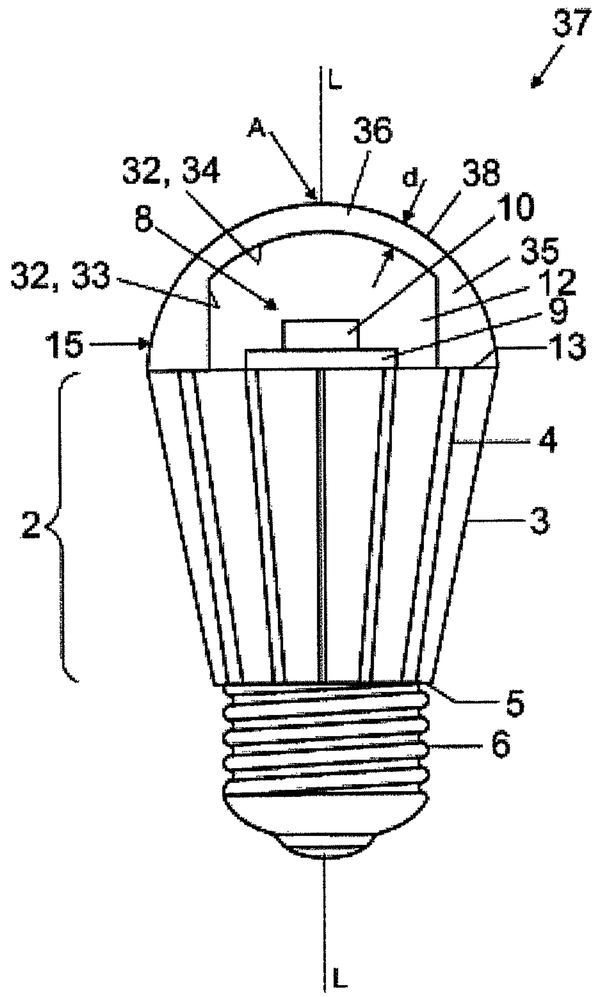
FIG. 8 shows a side view of a partial cross section of a bulb retrofit lamp in accordance with a further embodiment.

FIG. 8 shows a side view of a partial cross section of a retrofit lamp 37 in the form of a bulb retrofit lamp in accordance with a further exemplary embodiment.

The cover 38, in contrast to the retrofit lamp 1 shown in FIG. 1 and FIG. 2, merely has the form of a hemisphere on its outer side 15, with the result that it can be separated from a mold during production. It is likewise free from recesses on its inner side 32 (which, together with the heat sink 2, delimits the accommodating area 12). In particular, the inner side 32 is configured such that a lateral face 33 or side wall of the inner side 32 runs perpendicularly, starting from the lower side of the cover 31, i.e. a cylindrical shape or group of perpendicular faces merging with one another which is arranged in the form of a cylinder, for example, for simplifying production in the injection-molding process or pressing process. A cover face 34, which adjoins the lateral face 33 at the top and arches over the accommodating area 12, is again configured so as to be curved upwards or in the form of a dome, in particular spherically, on the other hand.

The wall thickness d is at its greatest at the contact face 13 and is reduced in a section 35 or region continuously as the distance from the contact face 13 increases, which contains the lateral face 33. The adjoining section 36 or region which contains the cover face 34 has a constant wall thickness d, on the other hand. As a result, the cover 38 continues to have, as with the retrofit lamp 1, a greater wall thickness d at the contact face 13 with respect to the heat sink 2 than at the point furthest removed from the heat sink 2, namely the (punctiform) apse A.

Alternatively, the section 36 can also continue to taper from its point of attachment to the section 35 towards the apse A.

Figure 9:
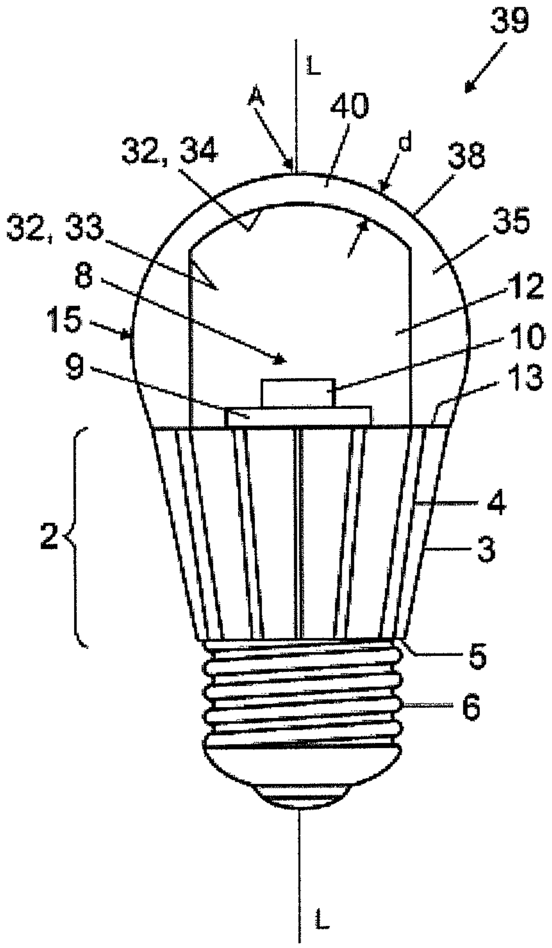
FIG. 9 shows a side view of a partial cross section of a bulb retrofit lamp in accordance with yet another embodiment.

FIG. 9 shows a side view of a partial cross section of a retrofit lamp 39 in the form of a bulb retrofit lamp in accordance with yet another embodiment. In contrast to the retrofit lamp 37, it now does not have a cover 40 with an outer side in the form of a hemisphere, but has a more than hemispherical outer side 15 like the cover 11 shown in FIG. 1 and FIG. 2. At the same time, the cover 40 has a perpendicular lateral face 33 on its inner side 32.

As a result, the wall thickness d is no longer at its greatest at the contact face 13, but at a greatest lateral extent of the cover 40 at a short distance from the contact face 13 and is reduced there continuously as the distance from the contact face 13 increases. However, this cover 40 also has a greater wall thickness d at the contact face 13 with respect to the heat sink 2 than at the point furthest removed from the heat sink, namely the (punctiform) apse A. This cover 40 also has the advantage of greater heat dissipation from the heat sink 2 in comparison with a cover with a constant wall thickness, in particular a small wall thickness as in the region of the apse A, for example.

It goes without saying that the present invention is not restricted to the exemplary embodiments shown.

Thus, in addition, the cover of the tubular cover which is closed on the lateral surface side does not need to be symmetrical with respect to a longitudinal axis.

The difference in the wall thickness d between the thickest point of the cover and the thinnest point of the cover can in general preferably assume a factor of between two and five.

The invention claimed is:

1. A lamp, at least comprising:

a heat sink, which bears at least one light source; and an at least partially optically transmissive cover for the at least one light source, said cover being fastened to the heat sink, the cover having a wall thickness (d) which, at least sectionally, tapers as the distance from the heat sink increases, the wall thickness being about between about two to five times thicker proximate to the heat sink than the wall thickness at a location distant from the heat sink.

2. The lamp as claimed in claim 1, comprising:

the cover having, on a contact face with respect to the heat sink, a greater wall thickness (d) than at a point furthest removed from the heat sink.

3. The lamp as claimed in claim 1, wherein said cover has a greatest wall thickness (d) at a contact face with respect to the heat sink.

4. The lamp as claimed in claim 1, wherein the wall thickness (d) of the cover tapers continuously as the distance from the heat sink increases.

5. The lamp as claimed in claim 3, wherein the wall thickness (d) of the cover tapers, sectionally, as the distance from the contact face with respect to the heat sink increases, and then the wall thickness (d) of the cover remains substantially constant.

6. The lamp as claimed in claim 1, wherein the cover is fastened to the heat sink by at least one bonding agent with good thermal conductivity.

7. The lamp as claimed in claim 1, wherein the cover has a thermal conductivity of between 1 W/(m·K) and 2 W/(m·K).

8. The lamp as claimed in claim 1, wherein the cover has, at least sectionally, a dome like shape.

9. The lamp as claimed in claim 1, wherein the cover has an open tubular shape.

10. The lamp as claimed in claim 1, wherein a contact face of the cover with respect to the heat sink at least partially corresponds to a lower resting face of the cover.

11. The lamp as claimed in claim 1, wherein the cover has a disk like shape.

12. The lamp as claimed in claim 11, wherein a contact face of the cover with respect to the heat sink is arranged laterally.

13. The lamp as claimed in claim 1, wherein the cover has an optical function.

14. The lamp as claimed in claim 1, wherein the cover is substantially free of recesses on its inner side.

15. A lamp, at least comprising:

a heat sink, which bears at least one light source; and an at least partially optically transmissive cover for the at least one light source, said cover being fastened to the heat sink, the cover having a wall thickness (d) which, at least sectionally, tapers as the distance from the heat sink increases, wherein the cover has a tubular shape which is closed, at least on the lateral surface side, and the heat sink is accommodated at least partially in the cover and is fastened at least partially on a lower region of the cover, the lower region of the cover and an upper region of the cover having a comparatively smaller wall thickness (d) than the two lateral regions of the cover.

16. The lamp as claimed in claim 1, wherein said light source is a semiconductor light emitting element.

17. The lamp as claimed in claim 1, wherein the cover consists of glass with a thermal conductivity of between 1 W/(m·K) and 2 W/(m·K).

18. A lamp, at least comprising:

a heat sink having a lateral surface and a mounting surface that bears at least one light source; and an at least partially optically transmissive tubular cover for the at least one light source, said tubular cover completely surrounding at least the lateral surface of the heat sink, the tubular cover having a wall thickness (d) which, at least sectionally, tapers as the distance from the heat sink increases.

19. The lamp as claimed in claim 18, wherein a cross-sectional contour of an inner side of the tubular cover is substantially circular.

* * * * *